United States Patent [19]

Miyake et al.

[11] Patent Number: 5,196,721
[45] Date of Patent: Mar. 23, 1993

[54] IMAGE READING DEVICE

[75] Inventors: Hiroyuki Miyake; Tsutomu Abe, both of Kanagawa, Japan

[73] Assignee: Fuji Xerox Co., Ltd., Tokyo, Japan

[21] Appl. No.: 803,728

[22] Filed: Dec. 9, 1991

Related U.S. Application Data

[63] Continuation of Ser. No. 578,609, Sep. 7, 1990, abandoned.

[30] Foreign Application Priority Data

Oct. 3, 1989 [JP] Japan .................................. 1-257142

[51] Int. Cl.⁵ .......................................... H01L 00/00
[52] U.S. Cl. .................................... 257/292; 257/296; 250/208.1
[58] Field of Search ......................... 357/30; 250/208.1

[56] References Cited

U.S. PATENT DOCUMENTS 4,931,661 6/1990 Fukaya et al. .................. 250/208.1

Primary Examiner—Jerome Jackson, Jr.
Attorney, Agent, or Firm—Finnegan, Henderson, Farabow, Garrett and Dunner

[57] ABSTRACT

An image reading device comprises a number of photoelectric conversion elements arrayed in the main scan direction so as to generate charges corresponding to optical density information of each extremely small area of an image on an original, and thin film transistors respectively connected in series with those photoelectric conversion elements, conduction of each thin film transistors being controlled by a preset voltage applied to the gate electrode thereof, and additional capacitor portions that are located closer to the photoelectric conversion elements with respect to the thin film transistors. The charges generated in the photoelectric conversion elements are stored in the stray capacitors of the photoelectric conversion elements, the overlap capacitors of the thin film transistors, and the additional capacitor portion.

9 Claims, 11 Drawing Sheets

IMAGE READING DEVICE

This application is a continuation of application Ser. No. 07/578,609, filed Sep. 7, 1990 now abandoned.

BACKGROUND OF THE INVENTION

The present invention relates to an image reading device used as an image read section of a facsimile, scanner, and the like, and more particularly to an arrangement of a capacitor section for temporarily storing the charge as generated by an photoelectric conversion element according to optical density information of each extremely small area on an image of an original.

An image reading device for reading an image on an original in close contact with the original is made up of an array of photoelectric conversion elements that are linearly arrayed, and a drive circuit for driving the array. Charges generated by the photoelectric conversion elements in the array are time sequentially picked up and output to a single output line by means of switches for sequentially selecting the photoelectric conversion elements. To individually drive a number of photoelectric conversion elements of the array, a number of drive IC chips are required. To cope with this, there has been developed an image reading device of the TFT drive type which employs such a parallel processing that switchings of several bits are simultaneously done by a-Si:H thin film transistors (TFT), thereby to reduce the required number of the drive IC chips and hence to reduce the cost to manufacture.

The image reading device of the TFT drive type, as shown in FIG. 16, is made up of a linear array of photoelectric conversion elements whose length is substantially equal to the width of an original, a charge transfer section 52 including thin film transistors $T_{k,n}$ provided for photoelectric conversion elements in one-to-one correspondence, and a multi-layer wiring section 53.

The linear array 51 consists of K number of blocks each including N number of photoelectric transducing elements 51'. Each photoelectric conversion element 51' may be equivalently expressed by the combination of a photo diode $PD_{k,n}$ and a stray capacitance $CD_{k,n}$. The photoelectric conversion elements 51' are respectively connected with the drains of thin film transistors $T_{k,n}$. The source electrodes of the transistors $T_{k,n}$ are respectively connected, for each block, with common signal lines 54 (N number of lines) and load capacitors $CL_n$, through multi-layer wires 53 arrayed in a matrix fashion. The gate electrodes of the thin film transistors $T_{k,n}$ are connected with a gate pulse generator (not shown), for conduction of each block. Photo charges generated by the photoelectric conversion elements 51' are temporarily stored, and then are sequentially transferred, for each block, to and stored in the load capacitors $CL_n$ by means of the thin film transistors $T_{k,n}$ as charge transfer switches. More specifically, in response to a gate pulse $\phi G_1$ generated from the gate pulse generator (not shown), the thin film transistors $T_{1,1}$ to $T_{1,n}$ of the first block are turned on. Charges as generated by and stored in those photoelectric conversion elements 51' are transferred to and stored in the load capacitors $CL_n$. Depending on the charges stored in the load capacitors $CL_n$, potentials in the common signal lines 54 vary. The voltage values are time sequentially picked up and output to the output line 56 by sequentially turning on the analog switches $SW_1$ to $SW_n$. In response to gate pulses $\phi G_1$ to $\phi G_n$, the thin film transistors $T_{2,1}$ to $T_{2,n}$, to $T_{k,1}$ to $T_{k,n}$ of the second to K-th blocks are turned on, and the charges from the photoelectric conversion elements are sequentially transferred for each block. In this way, the charges are sequentially read, to obtain an image signal of one line in the main direction of the original. By moving an original feed means (not shown), such as a roller, the above sequence of read operations is repeated, finally to obtain image signals of the whole original image.

A specific operation of the image reading device will be described with reference to an equivalent circuit (FIG. 17) of one bit which includes a single photoelectric conversion element 51'. To set up an initial state, a reset switch RS is closed. In turn, a reverse bias voltage (VB) is applied to the photo diode PD of the photoelectric conversion element 51'. A potential (VL) of the common signal line 54 is reset to 0 V. A light from a light source (not shown) is applied to an original (not shown) put on the photoelectric conversion element array, the light reflected at the original illuminates the photo diode PD. In the photo diode, photo current Ip flows whose amplitude depends on an optical density on the original, and the current causes the diode to generate charges. The charges are stored in a stray capacitor CD of the photoelectric conversion element 51' and an overlap capacitor Cgd between the gate and drain electrodes of the thin film transistor T. In response to a signal $\phi G$ from the gate pulse generator, the thin film transistor is turned on, and connects the photo diode PD and the common communication line 54. As a result, the charges are transferred to and stored in the load capacitor CL. Since the signal input of the multiplexer has high impedance, all the charges are stored in the capacitors in the circuit. Accordingly, the "charge transfer" means a re-allocation of charges to the capacitors (CD, Cgd) of the diode portion and the capacitors (CL, Cgs) in the common signal line portion. After the potential VL is detected after the transfer completion, the common signal line 54 are reset by the reset signal RS, to transfer the bit signals of the next block.

A structure of the photoelectric conversion element portion of the image reading device is as shown in FIGS. 18 and 19. As shown, a belt-like common electrode 62 made of metal, e.g., chromium (Cr), is formed on an insulating substrate 61. Photoelectric converting layers 63 made of amorphous semiconductor (a-Si, for example), separately every bit, are discretely formed on the common electrode 62. Individual electrodes 64 of transparent conductive films which are made from, for example, indium tin oxide (ITO), are formed on the photoelectric converting layers 63, respectively. An interlayer insulating film 65 is applied over the photoelectric converting layers thus formed. Wires 66 are formed, for each photoelectric conversion element, on the interlayer insulating film 65. The individual electrodes 64 and the wires 66 of the photoelectric conversion elements are interconnected through contact holes 67 each formed in the interlayer insulating film 65 above the end portion of the individual electrode 64.

With such a structure of the image reading device, charges generated in each photoelectric conversion element 51' are temporarily stored in the stray capacitance CD of the photoelectric conversion element 51' and the overlap capacitor Cgd between the drain and gate electrodes of the thin film transistor T. To improve the switching characteristic of the thin film transistor, it is necessary to reduce the overlap capacitor Cgd. The stray capacitance CD of the photoelectric conversion element 51' is determined by an area of a stray capacitance portion 68 (slanted area in FIG. 18). This portion is a shaded portion of each area of the image reading device where the photoelectric converting layer 63 is sandwiched between the common electrode 62 and the individual electrode 64. To improve the resolution with less interference between adjacent bits, the area of this portion must be reduced. For these reasons, it is difficult to secure the stray capacitance CD and the overlap capacitance Cgd large enough to store the generated charges.

Since the structure requires dielectric material for the semiconductor (a - Si), dielectric constant of the semiconductor varies depending on voltage application and exposed light amount. Therefore, the capacitance of the stray capacitor CD is unstable.

SUMMARY OF THE INVENTION

Accordingly, an object of the present invention is to provide an image reading device having a capacitor portion in the photoelectric conversion element portion, without any degradation of the switching characteristic of the thin film transistors and the resolution of the photoelectric conversion elements.

To solve the above problems, an image reading device according to the present invention comprises a number of photoelectric conversion elements arrayed in the main scan direction so as to generate charges corresponding to optical density information of each extremely small area of an image on an original, and thin film transistors respectively connected in series with those photoelectric conversion elements, conduction of each thin film transistors being controlled by a preset voltage applied to the gate electrode thereof, and new additional capacitor portions that are located closer to the photoelectric conversion elements with respect to the thin film transistors. The charges generated in the photoelectric conversion elements are stored in the stray capacitors of the photoelectric conversion elements, the overlap capacitors of the thin film transistors, and the additional capacitor portion.

In the image reading device, each additional capacitor portion may include a sandwich structure in that an interlayer insulating film is sandwiched between a wire connecting each photoelectric conversion element and each thin film transistor, and an upper or lower electrode overlaying or underlaying the wire.

In the image reading device, by utilizing the fact that the photoelectric conversion elements, thin film transistors, and capacitor portion can all be fabricated by thin film process, the upper or lower electrodes may be formed in a step of forming source and drain electrodes of the thin film transistors, or in a step of forming gate electrodes of the thin film transistors.

In the image reading device, each thin film transistor may include source and drain electrodes as arrayed in the main scan direction, a drain (source) electrode that is the same as the overlap capacitor portion closer to the photoelectric conversion elements is formed symmetrical with respect to the thin film transistors, thereby to form the additional capacitor portion.

The image reading device may be characterized in that each thin film transistor includes a plurality of drain or source electrodes, so that an area of an overlap capacitor portion of the thin film transistor closer to the photoelectric conversion element is increased, thereby to form the capacitor portion.

Further, the image reading device may be characterized in that the source and drain electrodes of each thin film transistor are arrayed in the main scan direction.

According to the invention as described above, the charges as generated in the photoelectric conversion elements are temporarily stored in the stray capacitors of the photoelectric conversion elements, overlap capacitors of the thin film transistors, and the additional capacitor portion. When the thin film transistor are turned on, the charges are transferred to load capacitors. The charges as transferred and stored in the load capacitors are sequentially picked up, thereby to obtain image information of said original image, Further, the thin film transistors and the capacitor portion may be simultaneously formed by thin film process.

Furthermore, the upper or lower electrodes may be formed in a step of forming source and drain electrodes of the thin film transistors, or in a step of forming gate electrodes of the thin film transistors. Accordingly, when the thin film transistors and the capacitor portion may be simultaneously formed by thin film process, the number of steps to form films may be reduced.

Furthermore, the additional capacitor is formed by drain (source) electrode which is the same as the overlap capacitor portion closer to the photoelectric conversion elements. With this feature, if in the photolitho process of the thin film transistors, a misalignment in the main scan direction occurs and the overlap capacitance of the thin film transistors varies, the capacitance variation may be corrected by the capacitor portion.

Furthermore, each thin film transistor includes a plurality of drain or source electrodes, so that the channel width can be increased.

DETAILED DESCRIPTION OF THE PREFERRED EMBODIMENTS

An embodiment of the present invention will be described with reference to the accompanying drawings.

Figure 1:
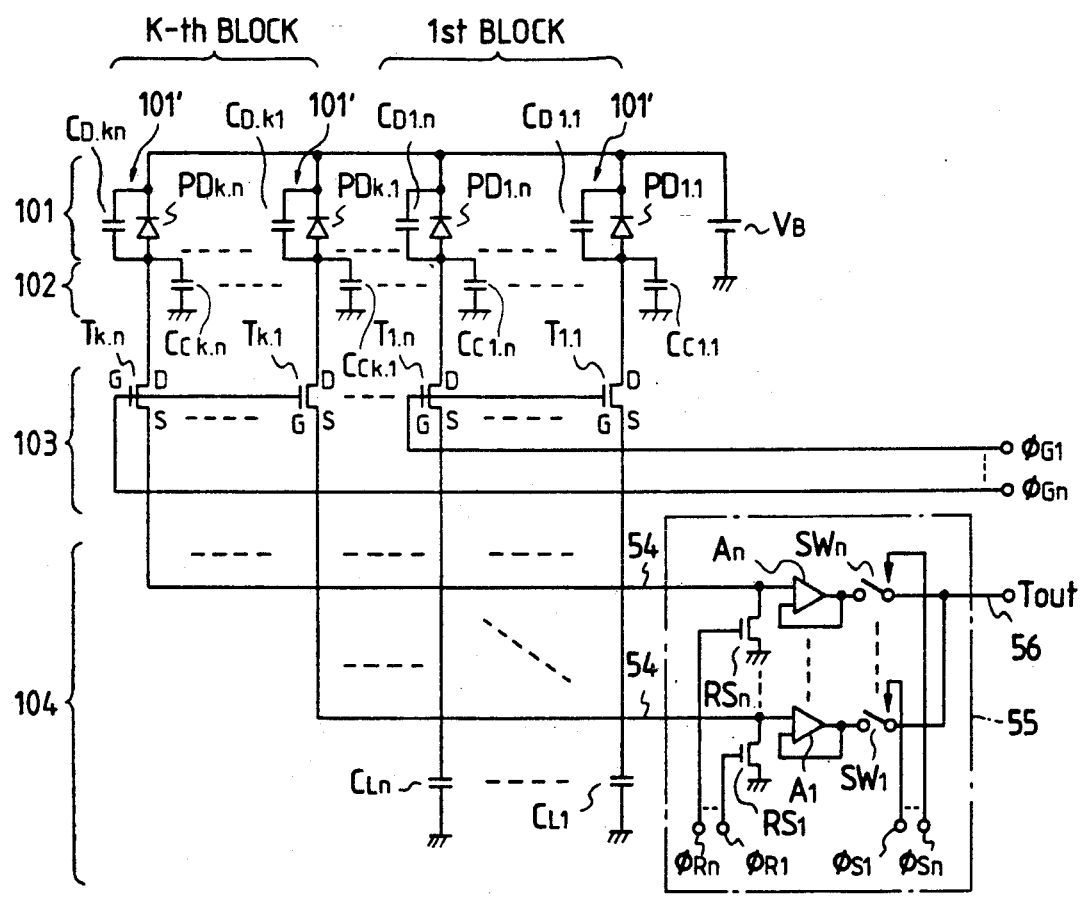
FIG. 1 is an equivalent circuit diagram of the present invention.

FIG. 1 shows an equivalent circuit of the present invention. As shown, an image reading device according to the present invention comprises an photoelectric conversion element array 101, a charge transfer section 103 in which thin film transistors T are arrayed in parallel, while being respectively connected with photoelectric conversion elements 101', a capacitor array 102 disposed between the photoelectric conversion element array 101 and the charge transfer section 103, and a multi-layer wiring section 104 connected to the charge transfer section 103.

Figure 16:
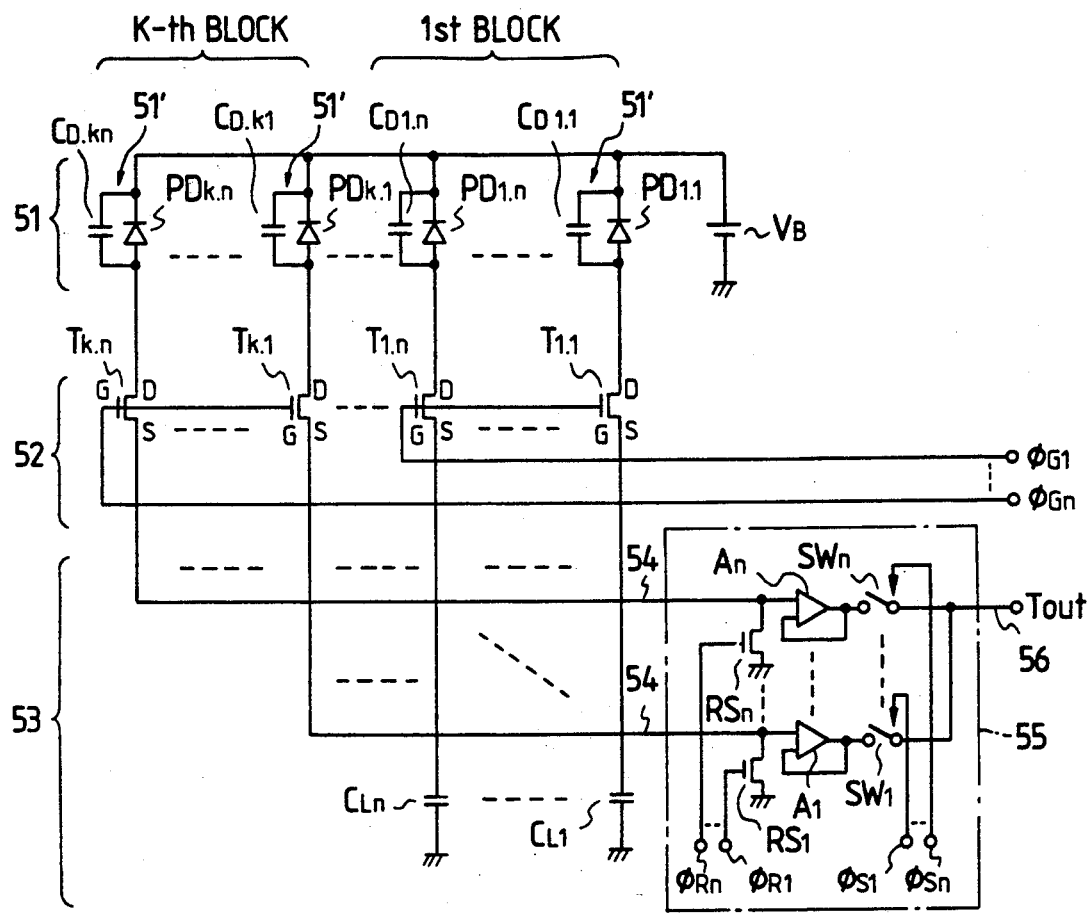
FIG. 16 is an equivalent circuit diagram of the conventional image reading device.
Figure 17:
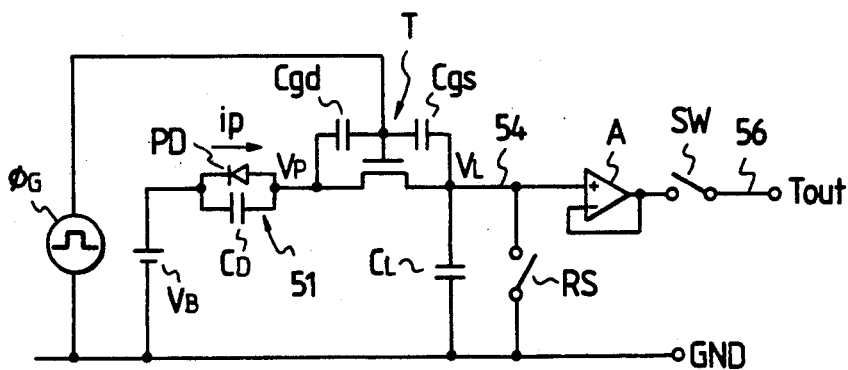
FIG. 17 is an equivalent circuit of a portion of one bit of the conventional image reading device.
Figure 18:
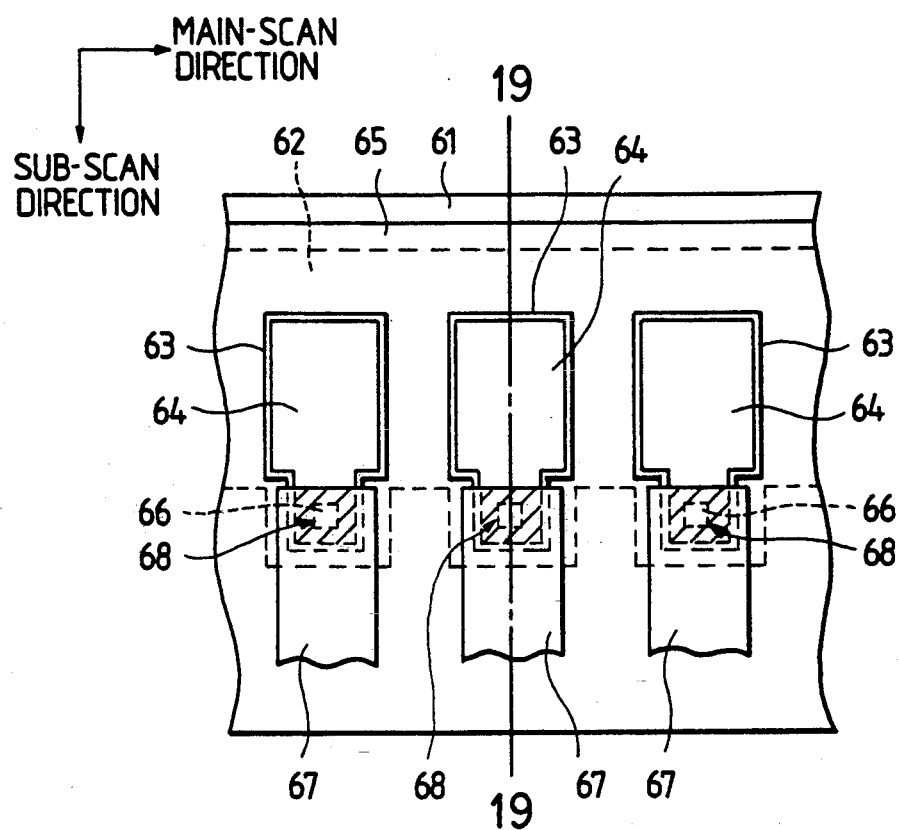
FIG. 18 is a partial plan view showing the conventional image reading device.
Figure 19:
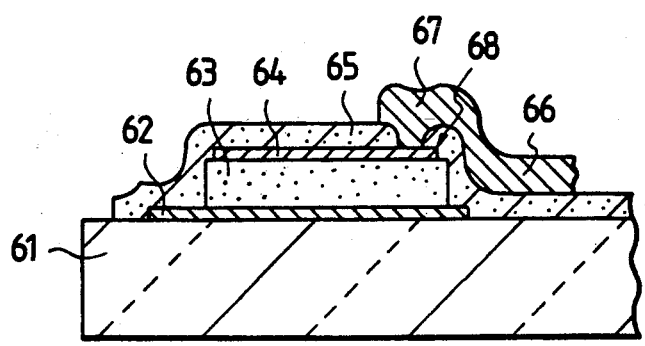
FIG. 19 is a sectional view taken on line H—H' in FIG. 18.

The capacitor array 102 includes the same number of capacitor portions Cc as that of the photoelectric conversion elements 101'. Each capacitor portion Cc is provided between the output of each photoelectric conversion element 101' and the input (drain electrode) of each thin film transistor T. The outputs (drain electrodes) of the thin film transistors T are connected with a drive IC 55, through the multi-layer wires 104 arrayed in a matrix. The remaining portion of the arrangement is the same as that of FIG. 16, and hence no description of it will be given.

The photoelectric conversion element array 101 has the width substantially equal to the width of an original. To read an image on an original of the size of B4 as ruled under JIS (Japanese Industrial Standard) at 200 SPI (spot per inch) of resolution, 2048 photoelectric conversion elements 101' (2048 bits) are linearly arrayed. Where the drive IC 55 of 64 bits which is capable of reading an image by a single chip IC is used, the number K of blocks is 32.

In operation, when the reflected light from an original illuminates the photoelectric conversion elements 101', charges are generated according to a distribution of optical densities on the original. The charges are distributed into stray capacitors $CD_{1,1}$ to $CD_{k,n}$, capacitor portions $Cc_{1,1}$ to $Cc_{k,n}$ and overlap capacitors of thin film transistors $T_{k,n}$ between the gate and drain electrodes of the thin film transistor $T_{k,n}$. When the thin film transistors $T_{k,n}$ are turned on for each block, the charges stored are transferred to the load capacitors $CL_1$ to $CL_n$, for each block.

A specific structure of the capacitor portion Cc will be described with reference to FIGS. 2 to 15.

Figure 2:
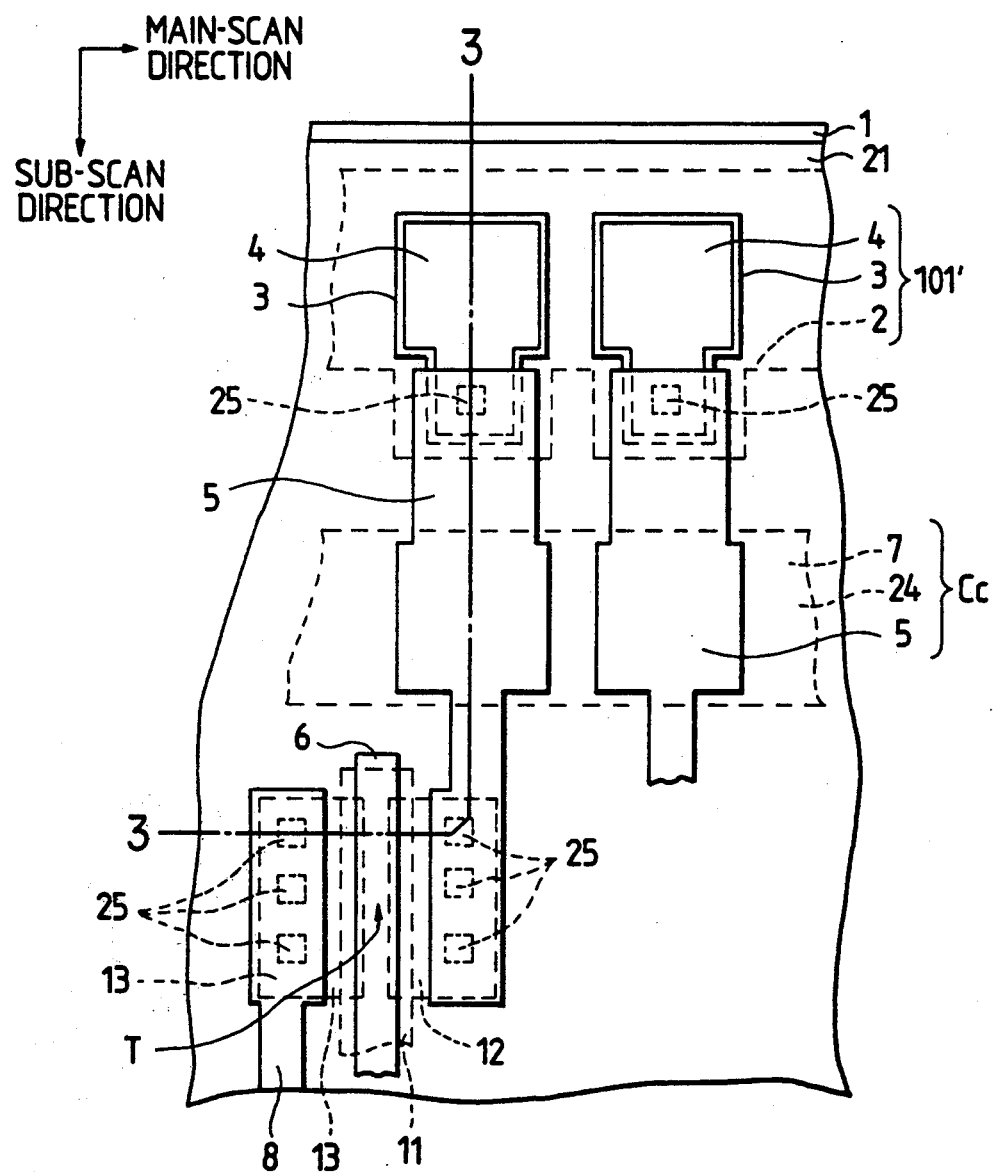
FIG. 2 is a partial plan view showing first embodiment of the present invention.
Figure 3:
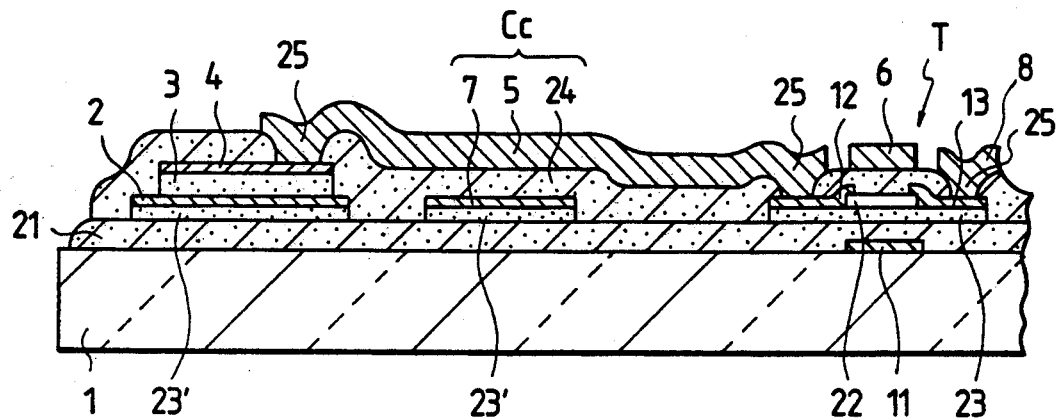
FIG. 3 is a sectional view taken on line A—A' in FIG. 2.

FIGS. 2 and 3 are a plan view and a sectional view showing a first embodiment of the present invention. A structure of the photoelectric conversion element 101' portion is the same as that of the conventional one. As shown, in this portion, a common electrode 2, photoelectric converting layer 3, and individual electrodes 4 are layered on an insulating substrate 1 in this order. The thin film transistor T has the inverse stagger structure in which the gate electrode 11 is formed the lowermost layer, as shown in FIG. 2. The drain electrode 12 is connected to a wire 5 which connects to the individual electrode 4 of the photoelectric conversion element 101'. The source electrode 13 is connected to a wire 8 connecting to the multi-layer wiring section 104. A light shield layer 6 is formed on each thin film transistor T to prevent the transistor from being turned on in response to directly incident light.

An interlayer insulating film 24 is formed under each wire 5. A lower electrode 7, which is shaped like a belt, and extends in the main scan direction, is formed under the interlayer insulating film 24. Intersections of the lower electrodes 7 and the wires 5, namely, the portions where the interlayer insulating films 24 each sandwiched by the lower electrode 7 and the wire 5 form the capacitor portions Cc. The wire 5 intersecting the lower electrode 7 is patterned to be a belt with a relatively broad width. With such a pattern, capacitance of the capacitor portion Cc is increased. The lower electrode 7 is kept at a fixed potential. For example, it is connected to the light shield layer 6, which is grounded, of the thin film transistor T, through a contact hole (not shown), and is set at ground level.

The photoelectric conversion elements 101', thin film transistors T and capacitor portions Cc are fabricated in the same process. This fabricating process will be described.

A first metal layer made of chromium (Cr), for example, is formed on an insulating substrate 1 made of glass, for example. Then, it is patterned in photolitho process, to form the gate electrodes 11 of the thin film transistors T.

The entire surface of the structure is covered with a first interlayer insulating film 21 (of SiNx, for example). A first amorphous semiconductor layer (of a-Si, for example) to form channels of the thin film transistors T is layered on the first interlayer insulating film 21. Further, an insulating film (of SiNx, for example) to protect the channels of the thin film transistors T is formed. Using the self-alignment to make an exposure from the rear side of the insulating substrate 1, the insulating film for the channel protection is etched by photolitho process to form channel protecting portions 22 having the same shape as that of the gate electrodes 11.

Then, a second metal layer (of Cr, for example) is applied over the entire surface of the structure, and etched by photolitho process, thereby to form the common electrode 2 of the photoelectric conversion elements 101', the lower electrodes 7 of the capacitor portions Cc, and the drain and source electrodes 12 and 13 of the thin film transistors T. The first amorphous semiconductor layer is etched by photolitho process, to form the channel portions 23 of the transistors T.

A second amorphous semiconductor layer (of a - Si, for example) and a transparent conductive film (of ITO, for example) are successively formed so as to cover the common electrode 2 of the photoelectric conversion elements 101', and then are etched by photolitho process, thereby to form photoelectric converting layers 3 and individual electrodes 4, which are separated every bit. At this point, the process to fabricate the photoelectric conversion elements 101' is completed.

A second interlayer insulating film 24 (of polyimide, for example) as transparent insulating material is formed over the entire surface of the insulating substrate 1. Contact holes 25 are formed at the second interlayer insulating film 24 on the portions of the individual electrodes 4, and the drain and source electrodes 12 and 13 of the thin film transistors T. A third metal layer (of aluminum Al, for example) is formed on the second interlayer insulating film 24. The third metal layer is etched by photolitho process, to form wires 5 connecting the individual electrodes to the drain electrodes 12 of the thin film transistors T, wires 8 connecting to the multi-layer wiring section, and the light shield layers 6 of the thin film transistors T, and to form the capacitor portions Cc between the photoelectric conversion elements 101' and the thin film transistors T. The first amorphous semiconductor layer 23' layered under the common electrodes 2 and the lower electrode 7 is left when the photoelectric conversion elements 101' and the capacitor portions Cc are fabricated in the process as mentioned above. And it is not essential to the construction of the photoelectric conversion elements 101' and the capacitor portions Cc.

Figure 4:
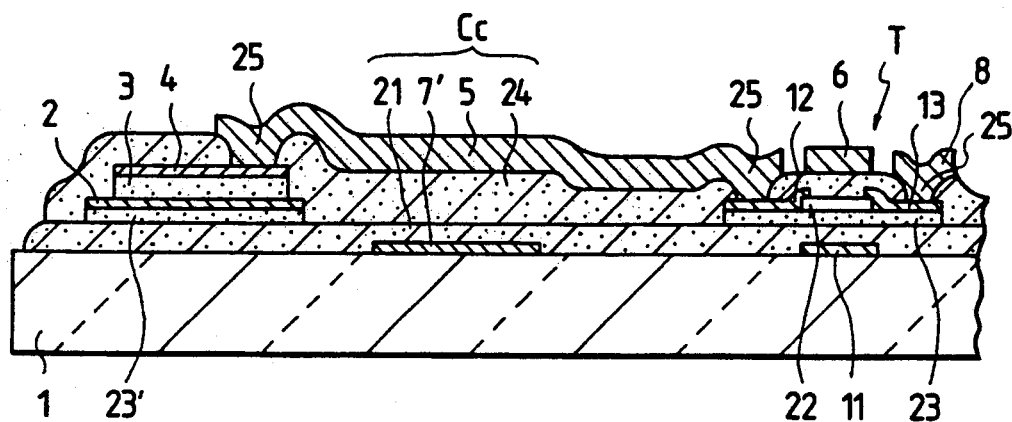
FIG. 4 is a sectional view showing second embodiment of the present invention.

FIG. 4 is a sectional view showing an image reading device according to a second embodiment of the present invention. In the image reading device, the lower electrodes 7' of the capacitor portions Cc are made of the same material as that of the gate electrodes of the thin film transistors T. Accordingly, the lower electrodes 7' are formed when the first metal layer is etched by photolitho process. The remaining structure of the device is substantially the same as that of the first embodiment, and hence like reference symbols are used to designate like or equivalent portions.

In the second embodiment, the portions where the first and second interlayer insulating films 21 and 24 are sandwiched by the lower electrodes 7' and the wires 5 are to be the capacitor portions Cc. With this structural feature, the breakdown voltage of the capacitor portions Cc is higher than that of the first embodiment.

Figure 5:
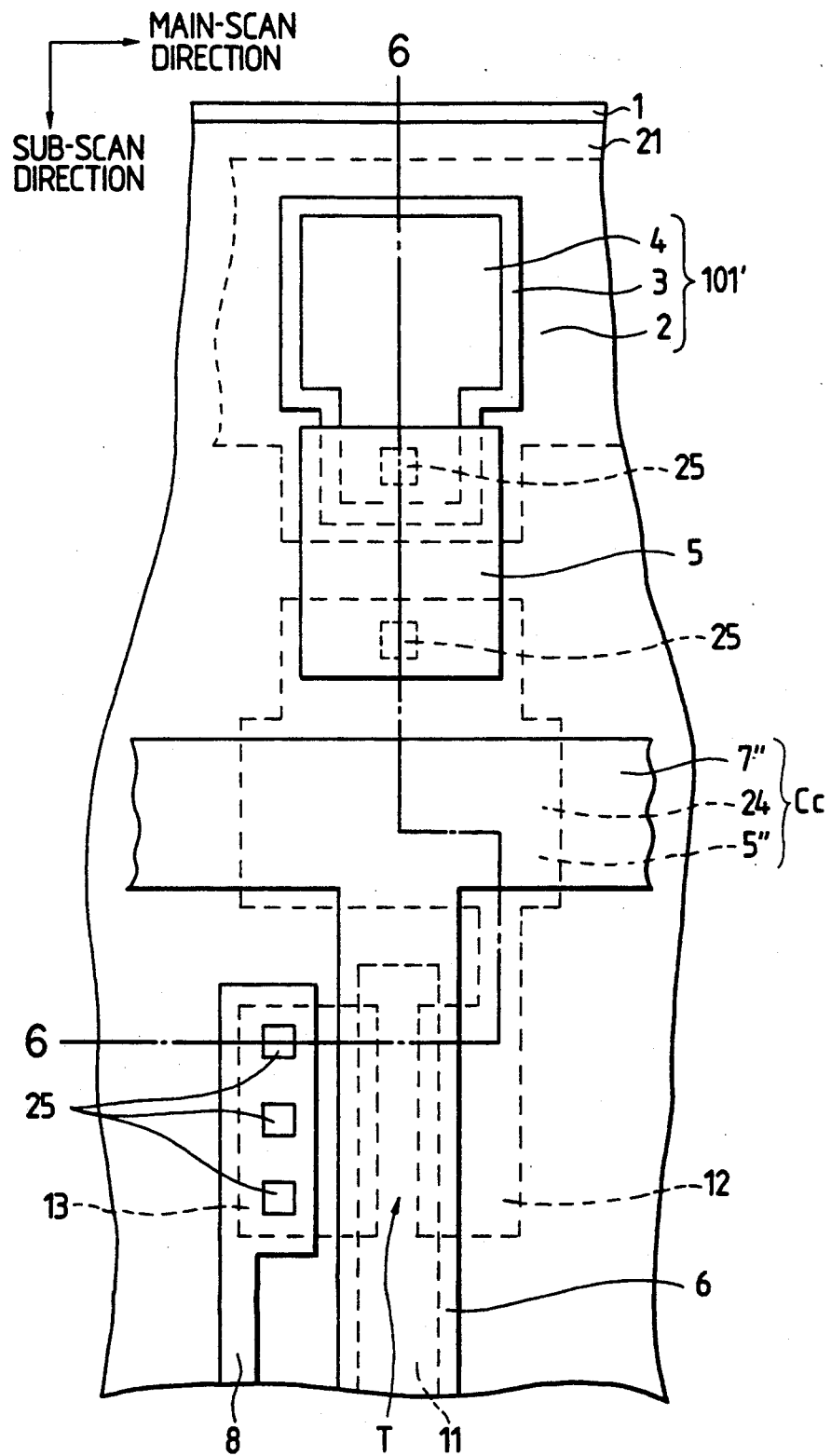
FIG. 5 is a partial plan view showing third embodiment of the present invention.
Figure 6:
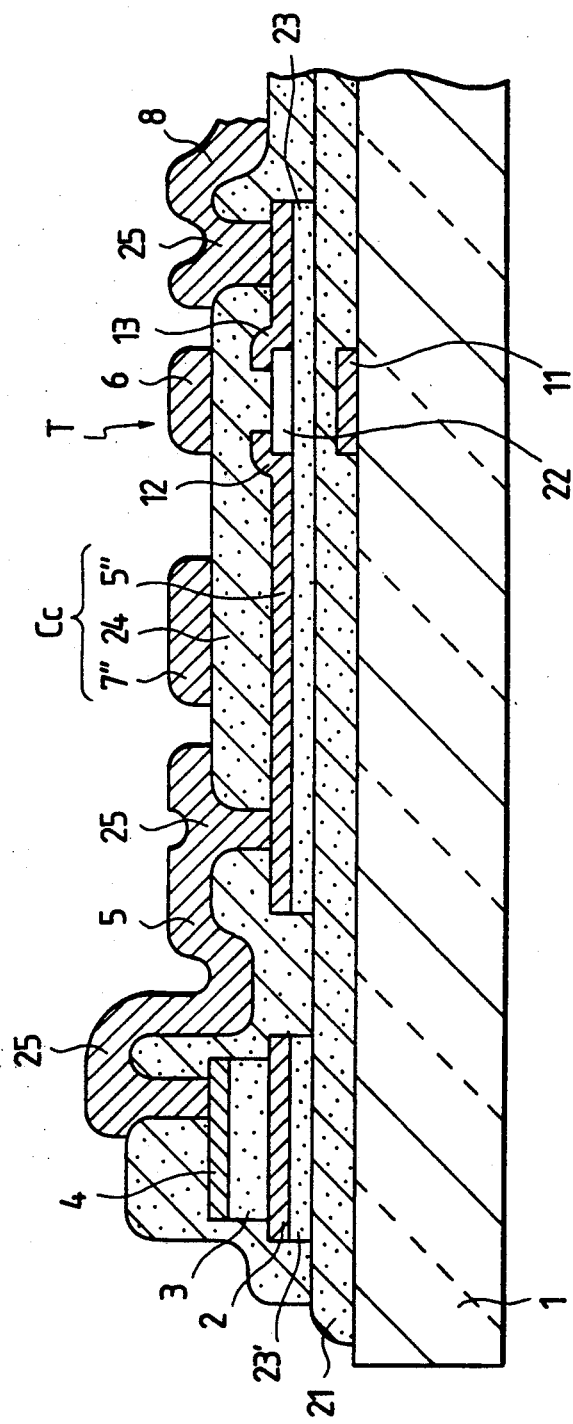
FIG. 6 is a sectional view taken on line B—B' in FIG. 5.

FIGS. 5 and 6 are a plan view and a sectional view showing a third embodiment of an image reading device according to the present invention. The third embodiment is modified the embodiment of FIG. 2 so that the lower electrodes 7 shaped like a belt are formed above the interlayer insulating films 24, in the form of the upper electrodes. Specifically, the upper electrode 7" of each capacitor portion Cc is formed by a third metal layer (Al) shaped like a belt. The lower electrode is formed by a wire 5" portion extended from the drain electrode of the thin film transistor T. Accordingly, the portion where the interlayer insulating film 24 sandwiched between the upper electrode 7" and the wire 5" serves as the capacitor portion Cc. The wire 5" is connected to the wire 5 through the contact hole 25, thereby to connect the photoelectric conversion element 101' to the thin film transistor T. The upper electrode 7" is connected to the light shield layer 6 of the transistor T, and is kept at the ground level (fixed level). The remaining structure of the instant embodiment is substantially the same as that of the first embodiment, and hence like reference symbols are used to designate like or equivalent portions.

Alternatively, the lower electrodes may be formed of the same material as that of the gate electrode 11 by patterning the first metal layer by photolitho process. In this case, the lower electrodes and the wires 5" sandwich the interlayer insulating film 21, thereby to form the capacitor portions Cc.

In the embodiments thus far mentioned, the thin film transistors T used are of the inverse stagger type in which the gate electrodes 11 are the lowermost layer. If required, the gate electrodes may be formed in the upside of the transistors. In this case, the upper electrodes (the upper electrodes in FIG. 6) are fabricated in the same process as that for forming the gate electrodes of the thin film transistors T.

Figure 7:
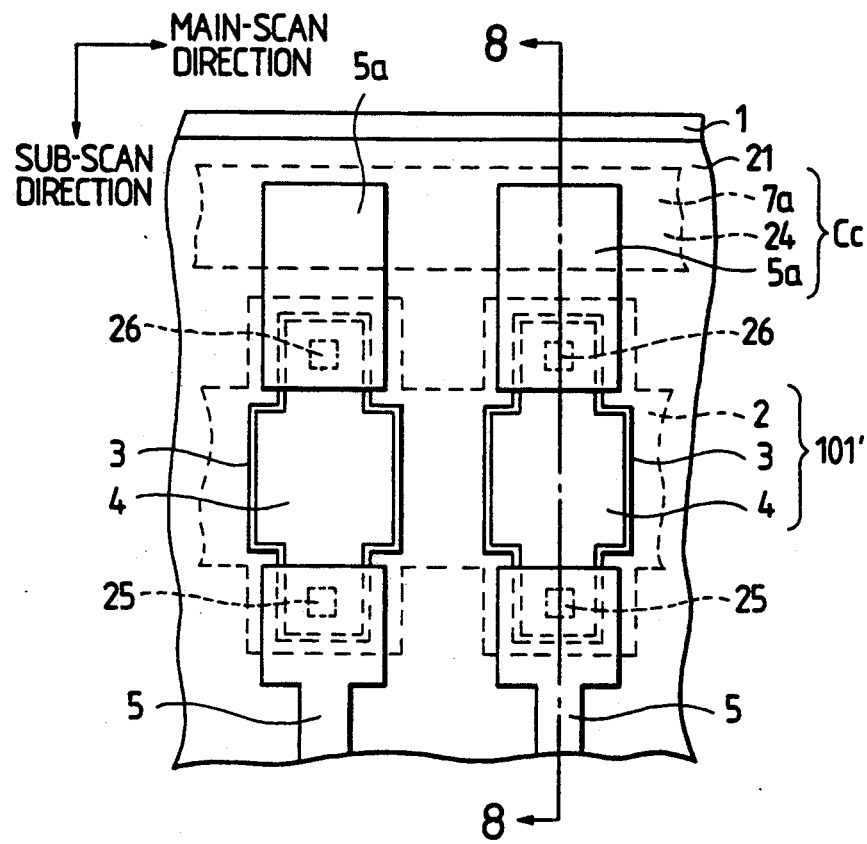
FIG. 7 is a partial plan view showing fourth embodiment of the present invention.
Figure 8:
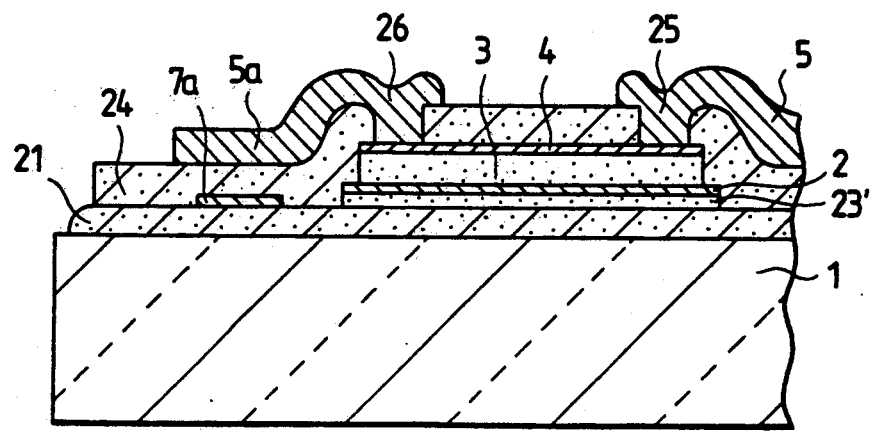
FIG. 8 is a sectional view taken on line C—C' in FIG. 7.

FIGS. 7 and 8 are a plan view and a sectional view showing an image reading device according to an fourth embodiment of the present invention. In the instant embodiment, the capacitor portions Cc are formed on the side of the photoelectric conversion elements 101' which is opposite to its side closer to the thin film transistors T (this side of the elements 101' will be referred to as an opposite side). More specifically, the lower electrodes 7a are formed under the second interlayer insulating film 24 which is formed on the opposite side of the photoelectric conversion elements 101' by patterning the second metal layer by photolitho process. Those electrodes 7a are shaped like belts extending in the main scan direction. Lead wires 5a corresponding to the photoelectric conversion elements 101' are formed on the second interlayer insulating films 24 in the same process as that for forming the wires 5. In the process, the patterning by photolitho process is used for forming those wires. The end of each lead wire 5a which is closer to the photoelectric conversion element 101' is connected to each individual electrode 4, through the contact hole 26 formed in the opening of the second interlayer insulating film 24. The portion where the lower electrode 7a and the lead wire 5a sandwiches the interlayer insulating film 24, serves as each capacitor portion Cc. Like or equivalent portions in the first embodiment are designated by like reference numerals, for simplicity. It is evident that the lower electrodes 7a may be formed by patterning the first metal layer by photolitho process.

Figure 9:
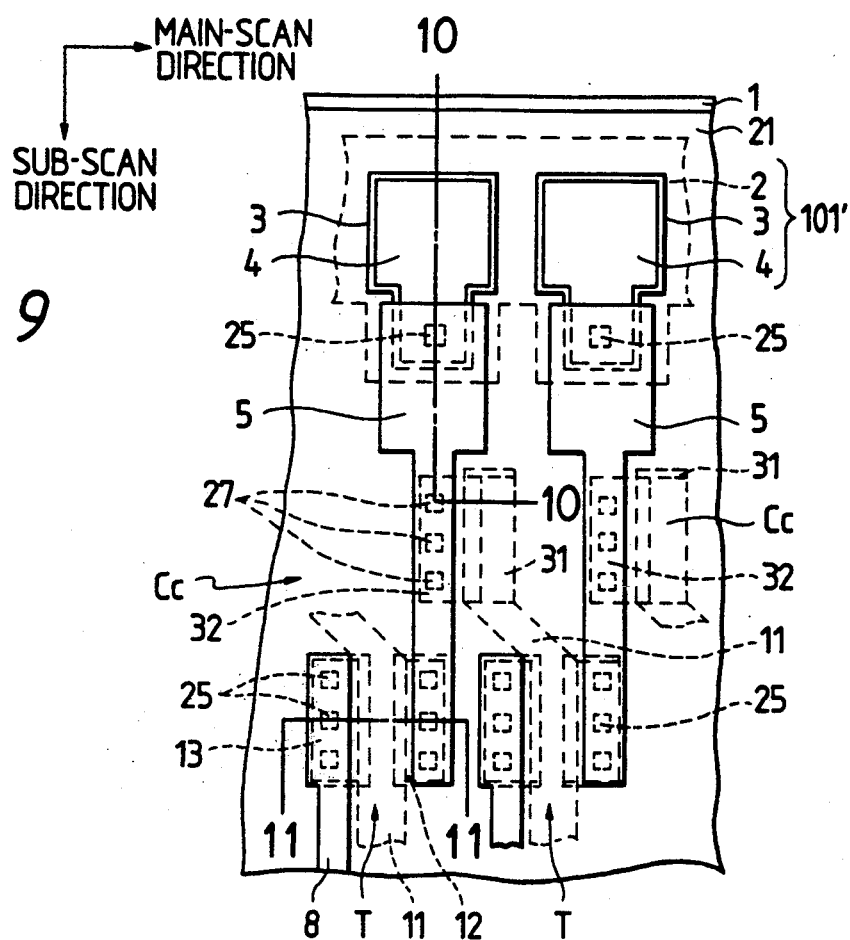
FIG. 9 is a partial plan view of fifth embodiment of the present invention.
Figure 10:
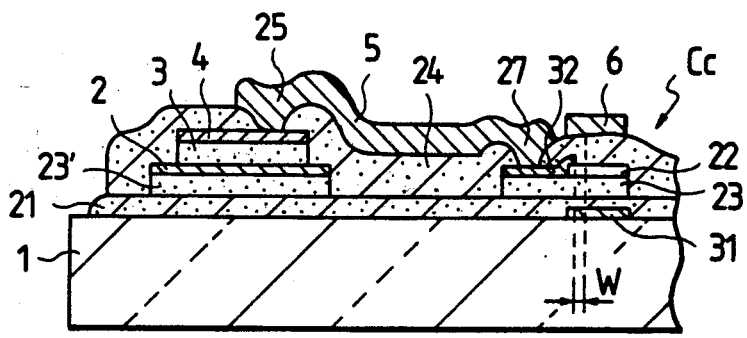
FIG. 10 is a sectional view taken line D—D' in FIG. 9.
Figure 11:
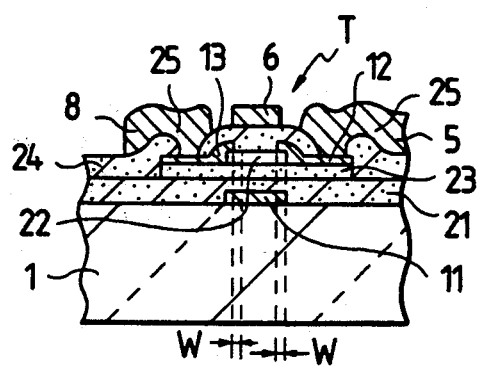
FIG. 11 is a sectional view taken line E—E' in FIG. 9.

FIGS. 9 to 11 are a plan view and sectional views of an image reading device according to a fifth embodiment of the present invention. The drain electrode whose capacitance is equal to an overlap capacitance formed between the gate electrode and the drain electrode of the thin film transistor T, intervenes as the capacitor portion Cc between the photoelectric conversion element 101' and the thin film transistor T. In FIGS. 9 through 11, like or equivalent portions in the first embodiment are designated by like reference symbols.

In the instant embodiment, the capacitor portion Cc comprises the lower electrode 31 corresponding to the gate electrode, first interlayer insulating film 21, channel portion 23, and channel protecting portion 22. As shown in FIG. 10, the structure of the instant image reading device is equivalent to that where the source electrode of the thin film transistor is removed. The drain electrode 12 and the source electrode 13 of the thin film transistor T are arrayed in the direction in which the photoelectric conversion elements 101' are arrayed (main scan direction). The capacitor portion Cc is located in place where it opposes the thin film transistor T with respect to the wire 5 (symmetrical to the thin film transistor T with respect to the wire as viewed in the main scan direction), and is obtained by turning the drain electrode 12 of the thin film transistor T by 180 degrees and displacing it in the sub-scan direction. The width of the lower electrode 31 of the capacitor portion Cc, and the width of the upper electrode 32 are equal to the widths of the gate electrode 11 and the drain electrode 12, respectively. A capacitance of each capacitor portion Cc is equal to that of the overlap capacitor formed between the gate and drain electrodes 11 and 12 of the thin film transistor T. The upper electrode 32 of the capacitor portion Cc is connected to the wire 5 that is connected through the contact hole 27 to the individual electrode 4. The lower electrode 31 of the capacitor portion Cc is connected to the gate electrode 11 of the thin film transistor T adjacent to it. Since the gate electrodes 11 of the thin film transistors T are all at the same potential in one block, the lower electrodes 31 can be kept at a fixed potential. If required, the lower electrode 31 and the light shield layer 6 of the transistor T (omitted in FIG. 9 for simplicity) are interconnected through the contact hole (not shown) so that the lower electrodes 31 are kept at the ground level (light shield layers 6 are grounded). The capacitor portions Cc and the thin film transistors T are formed in the same process, as referred to in the first embodiment.

In the instant embodiment, when the thin film transistors T is exposed by photolitho process, if the pattern of the drain electrode 12 is displaced in the main scan direction due to alignment failure, so that the overlap capacitance between the gate electrode 11 and the drain electrode varies. At this time, the pattern of the capacitor portion Cc is likewise displaced. Consequently, the overlap capacitor of the capacitor portion varies so as to cancel out the variation of the overlap capacitance. To be more specific, if the pattern of the thin film transistor T is displaced by width "w" in FIG. 11, the pattern of the capacitor portion Cc is also displaced by "w" to the right in FIG. 10. Accordingly, the overlap capacitance between the gate electrode 11 and the drain electrode 12 of the thin film transistor T decreases, but the overlap capacitance of the capacitor portion Cc is increased by a capacitance amount to the decreased capacitance. As a consequence, the sum of the overlap capacitance between the gate and drain electrodes 11 and 12 of the transistor T and the overlap capacitance between the lower electrode 31 and the upper electrode 32 of the capacitor portion Cc is kept constant. As a result, the uniformity of the output voltages picked up from the photoelectric conversion elements 101' can be secured.

When the overlap capacitance on the drain electrode 12 side varies, the overlap capacitance on the source side necessarily varies. The charge as stored in the stray capacitor of the photoelectric conversion element 101' and the overlap capacitor on the drain electrode side 12 of the transistor T are distributed into the overlap capacitor on the source electrode 13 side of the transistor T and the load capacitor CL connecting to the multi-layer wiring section 104. If the capacitance of the load capacitor CL is set to be much larger than the overlap capacitance on the source electrode 13 side (for example, 99:1), a variation of the overlap capacitance on the source electrode 13 side has little influence the picked up output voltage.

Figure 12:
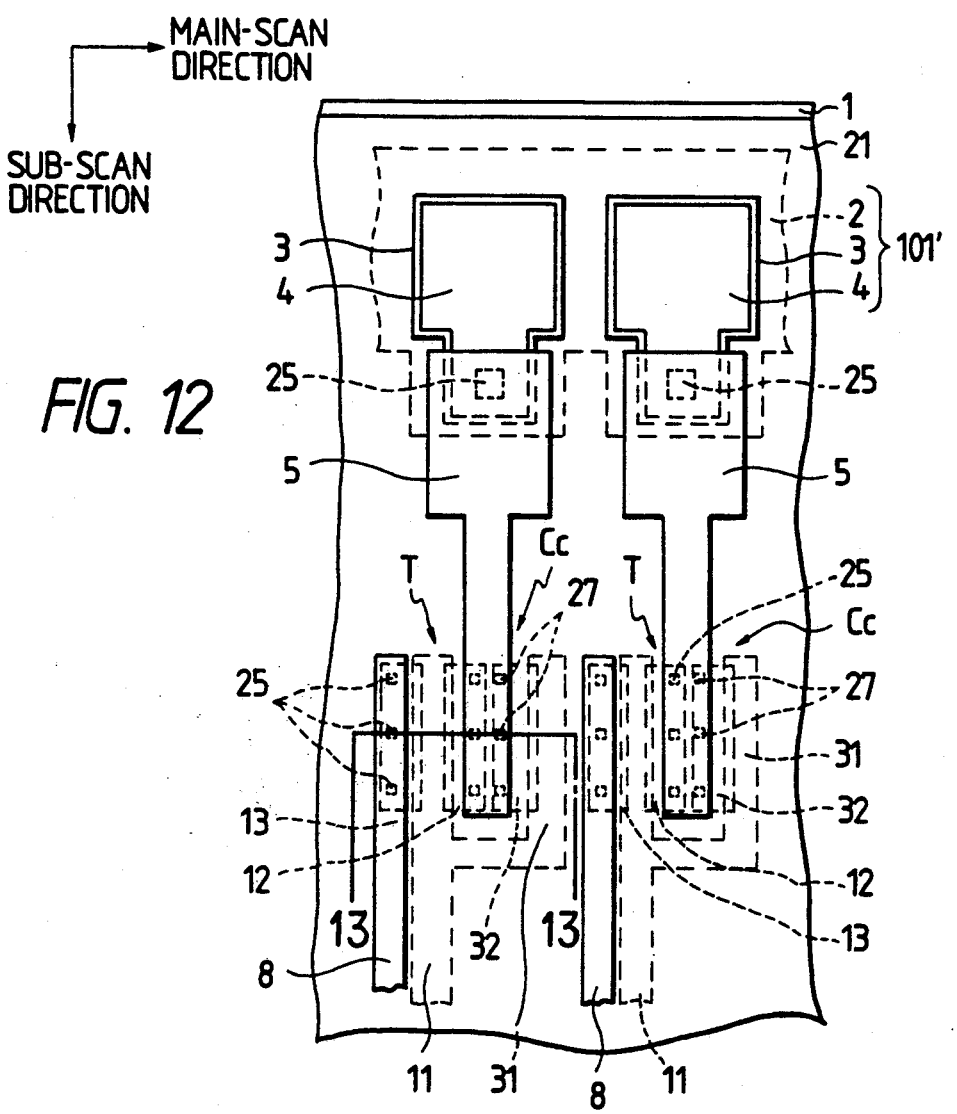
FIG. 12 is a partial plan view of sixth embodiment of the present invention.
Figure 13:
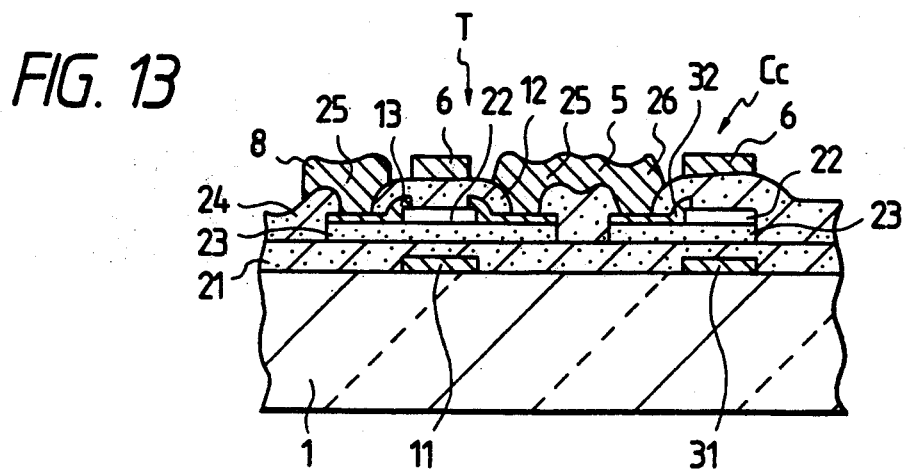
FIG. 13 is a sectional view taken line F—F' in FIG. 12.

FIGS. 12 and 13 are a plan view and a sectional view showing an image reading device according to the sixth embodiment of the present invention. As shown, the thin film transistors T and the capacitor portions Cc are arrayed in a line. The source electrodes 13, drain electrodes 12 and the upper electrodes 32 are also linearly arrayed. The lower electrode 31 is connected to the gate electrode 11 within the same bit. In FIG. 12, the light shield layer 6 is omitted for simplicity of illustration.

Figure 14:
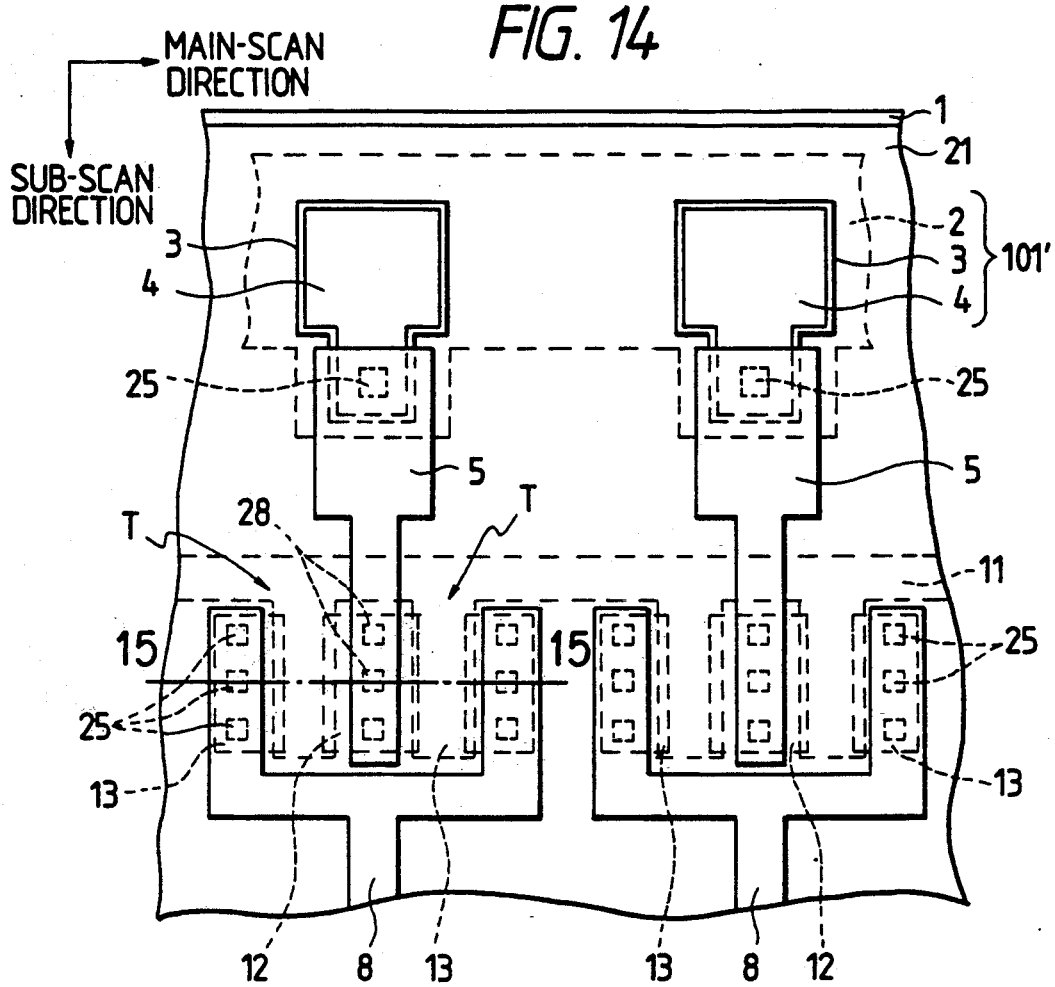
FIG. 14 is a partial plan view of seventh embodiment of the present invention.
Figure 15:
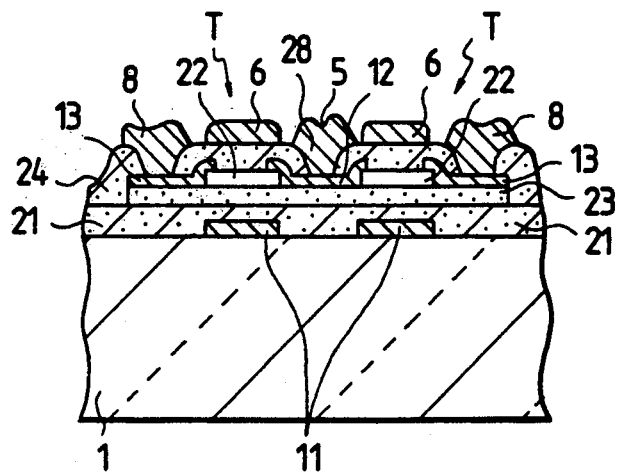
FIG. 15 is a sectional view taken line G—G' in FIG. 14.

FIGS. 14 and 15 are a plan view and a sectional view showing an image reading device according to the seventh embodiment of the present invention. In the instant embodiment, each thin film transistor, which is provided with two source electrodes in connection with the drain electrode is connected with the corresponding photoelectric conversion element 101'. With such thin film transistors, an area of the overlap capacitor portion of the thin film transistor T, which is closer to the photoelectric conversion element 101', is increased to provide the capacitor portion. To be more specific, the wire 5 connected to the photoelectric conversion element 101' is connected to the drain electrode 12, through the contact hole 28. Two source electrodes 13 are formed symmetrically with respect to the wire 5, in connection with the drain electrode 12. Lead portions of the gate electrodes 11 are formed in the underlayer between the drain electrode 12 and the source electrodes 13. Accordingly, its overlap capacitor has doubled capacitance. The source electrode 13, drain electrode 12, and the source electrode 13 of the thin film transistor T are linearly arrayed in the main scan direction.

Also in the instant embodiment, as in the sixth embodiment, during the exposure process of the thin film transistors by photolitho process, if the alignment is disarrayed, the pattern of the drain electrodes 12 as viewed in the main scan direction is also displaced. As a result, the overlap capacitance between the gate electrode 11 and the drain electrode 12 varies. With the variation of the overlap capacitance, the pattern of another thin film transistor T likewise varies, so that the overlap capacitance between the gate electrode 11 and the drain electrode 12 varies so as to cancel out the variation of the previous overlap capacitance. Accordingly, the overlap capacitances of the gate electrodes 11 and the drain electrodes of the thin film transistors T can be kept at a fixed value. The output voltages of the photoelectric conversion elements 101' are uniform in value.

Further, in the instant embodiment, the whole overlap capacitance between the gate electrode 11 and the source electrode 13 of the thin film transistor T can be kept at a fixed value. Accordingly, a design freedom of the load capacitor CL is increased, that is, there is no need of increasing the load capacitor with respect to the overlap capacitance between the gate electrode and the source electrode of the thin film transistor. However, in order to increase a transfer speed, the load capacitor should be appropriately increased with respect to the capacitance closer the photoelectric conversion element.

Since two source electrodes 13 are provided for one drain electrode 12, the channel width can be doubled. Accordingly, the channel resistance and the transfer time as well are reduced.

According to the invention, the capacitor portions are additionally provided to the portion closer to the photoelectric conversion elements. With this, the stray capacitor of each photoelectric conversion element, the overlap capacitor of each thin film transistor, and the capacitor portion additionally provided cooperate to provide capacitance enough to store charges as generated by the photoelectric conversion element.

Further, the thin film transistors and the capacitor portions are fabricated by thin film process. Therefore, both elements can be fabricated in the same process.

Furthermore, the upper or lower electrodes are formed by the layer as formed in the same process as that to form the gate electrode. Accordingly, the number of process steps can be decreased when the thin film transistors and the capacitor portions are formed in the same thin film process. And the breakdown voltage of the capacitor portion can be increased.

Furthermore, the capacitor portion is formed by the source or drain electrode of the same structure of the overlap capacitor portion on the photoelectric conversion element side. With this feature, if the alignment is disarrayed in the main scan direction in the photolitho process of the thin film transistors, and the overlap capacitance of the thin film transistor varies, the capacitor portion compensates for the variation. As a result, the output voltage of the photoelectric conversion elements are uniform in value.

Furthermore, plurality of source electrodes may be provided for one drain electrode to increase the channel width. As a result, the channel resistance and the transfer time as well are reduced.

What is claimed is:

1. A device for reading an image of a scanned original document, comprising:
    a plurality of photoelectric conversion elements arrayed in a main scan direction so as to generate charges corresponding to optical density information of specific portions of the image of the original document, each of the conversion elements having first and second ends;
    a corresponding plurality of thin-film transistors, each of said thin-film transistors including a gate electrode, a source electrode, and a drain electrode, wherein the drain electrode of each of said thin-film transistors is connected in series with the first end of a corresponding one of said photoelectric conversion elements;
    a corresponding plurality of discrete storage capacitors, each of said storage capacitors being connected to the second end of a corresponding one of said photoelectric conversion elements; and
    a corresponding plurality of load capacitors, each connected to the source electrode of a corresponding one of said thin-film transistors;
    wherein the charges generated by each of said photoelectric conversion elements are initially stored in said corresponding one of said storage capacitors and, when each of said thin-film transistors is sequentially activated, the charges stored in each of said corresponding storage capacitors are transferred to said corresponding one of said load capacitors where the charges are sequentially read to obtain image information of the original image.

2. A device for reading an image of a scanned original document, comprising:
    a plurality of photoelectric conversion elements arrayed in a main scan direction so as to generate charges corresponding to optical density information of specific portions of the image of the original document, each of the conversion elements having first and second ends;
    a corresponding plurality of thin-film transistors, each of said thin-film transistors including a gate electrode, a source electrode, and a drain electrode, wherein the drain electrode of each of said thin-film transistors is connected in series with the first end of a corresponding one of said photoelectric conversion elements, and wherein each of said thin-film transistors has an overlap capacitance between is drain and gate electrodes;
    a corresponding plurality of discrete storage capacitors, each of said storage capacitors being connected to the drain electrode of a corresponding one of said thin-film transistors, and having a capacitance equal to the overlap capacitance of said corresponding one of said thin film transistors; and
    a corresponding number of load capacitors, each of said load capacitors connected to the source electrode of a corresponding one of said thin-film transistors;
    wherein the charges generated by each of said photoelectric conversion elements are initially stored in said corresponding one of said storage capacitors and, when each of said thin-film transistors is sequentially activated, the charges stored in each of said corresponding storage capacitors are transferred to the corresponding one of said load capacitors where the charges are sequentially read to obtain image information of the original image.

3. The device of claim 2, wherein each of said storage capacitors comprises a first electrode and a second electrode overlapping the first electrode.

4. The device of claim 3, wherein the second electrode of each of said storage capacitors is the drain electrode of the corresponding one of said thin-film transistors and the first electrode of each of said storage capacitors is connected to the gate electrode of an adjacent one of said thin-film transistors.

5. The image reading device of claim 3, wherein the second electrode of each of said storage capacitors is the drain electrode of a corresponding one of said thin-film transistors and the first electrode of each of said storage capacitors is connected to the gate electrode of said corresponding one of said thin-film transistors.

6. A device for reading an image of a scanned original document, comprising:
    a plurality of photoelectric conversion elements arrayed in a main scan direction so as to generate charges corresponding to optical density information of specific portions of the image of the original document, each of the conversion elements having first and second ends;
    a corresponding plurality of thin-film transistors, each of said thin-film transistors including a gate electrode, a source electrode, and a drain electrode having first and second longitudinally-extending side edges, wherein the drain electrode of each of said thin-film transistors is respectfully connected in series with the first end of a corresponding one of said photoelectric conversion elements, and wherein each of said thin-film transistors has an overlap capacitance between its drain and gate electrodes which results from the first side edge of the drain electrode overlapping the gate electrode;
    a corresponding plurality of discrete storage capacitors, each of said storage capacitors comprising a first electrode and a second electrode, the second electrode being coplanar with and substantially parallel to the drain electrode of a corresponding one of said thin-film transistors, the second electrode having first and second longitudinally-extending side edges which respectively identify the same relative sides of the second electrode as the first and second longitudinally-extending side edges of the drain electrode, wherein the second electrode of each of said storage capacitors is electrically connected to the drain electrode of a corresponding one of said thin-film transistors and the second side edge of the second electrode of each of said storage capacitors overlaps the first electrode; and a corresponding plurality of load capacitors, each connected to the source electrode of a corresponding one of said thin-film transistors;

wherein the charges generated by each of said photoelectric conversion elements are initially stored in a corresponding one of said storage capacitors and, when each of said thin-film transistors is sequentially activated, the charges stored in each of said corresponding storage capacitors are transferred to a corresponding one of said load capacitors where the charges are sequentially read to obtain image information of said original image.

7. The device of claim 6, wherein the first electrode of each of said storage capacitors is connected to the gate electrode of an adjacent one of said thin-film transistors.

8. The device of claim 6, wherein the first electrode of each of said storage capacitors is connected to the gate electrode of said corresponding one of said thin-film transistors.

9. A device for reading an image of a scanned original document, comprising:

a plurality of photoelectric conversion elements arrayed in a main scan direction so as to generate charges corresponding to optical density information of specific portions of the image of the original document;

a corresponding plurality of switching means for controlling the transfer of the charges generated by said photoelectric converting elements, each of said switching means including two thin-film transistors having a common drain electrode, and having respective gate electrodes coupled together and respective source electrodes coupled together, wherein the common drain electrode of said thin-film transistors of each of said switching means is connected in series with a corresponding one of said photoelectric conversion elements;

a corresponding plurality of load capacitors, each connected to the coupled source electrodes of a corresponding one of said switching means;

wherein the charges generated by each of said photoelectric conversion elements are transferred to the corresponding one of said load capacitors when each of said switching means are sequentially activated, said charges are then sequentially read from said load capacitors to thereby obtain image information of said original image.

* * * * *

UNITED STATES PATENT AND TRADEMARK OFFICE
CERTIFICATE OF CORRECTION

PATENT NO. : 5,196,721

DATED : March 23, 1993

INVENTOR(S) : Hiroyuki Miyake et al.

It is certified that error appears in the above-indentified patent and that said Letters Patent is hereby corrected as shown below:

On the title page:
Abstract, front page, line 8, change "transistors"
to -- transistor--.

Claim 2, column 11, line 64, change "is"
to -- its--.

Claim 6, column 12, line 45, change "respectfully"
to --respectively--.

Signed and Sealed this

Fifteenth Day of February, 1994

Attest:

BRUCE LEHMAN

*Attesting Officer*     *Commissioner of Patents and Trademarks*